(12) United States Patent
Moue

(10) Patent No.: US 8,581,764 B2
(45) Date of Patent: Nov. 12, 2013

(54) DELTA-SIGMA MODULATOR AND SIGNAL PROCESSING SYSTEM

(75) Inventor: Takashi Moue, Kanagawa (JP)

(73) Assignee: Sony Corporation, Tokyo (JP)

( * ) Notice: Subject to any disclaimer, the term of this patent is extended or adjusted under 35 U.S.C. 154(b) by 16 days.

(21) Appl. No.: 13/343,017

(22) Filed: Jan. 4, 2012

(65) Prior Publication Data

US 2012/0200437 A1 Aug. 9, 2012

(30) Foreign Application Priority Data

Feb. 4, 2011 (JP) .................................. 2011-022365

(51) Int. Cl.
*H03M 3/00* (2006.01)

(52) U.S. Cl.
USPC .......................................... 341/143; 341/155

(58) Field of Classification Search
USPC .................................................. 341/143, 155
See application file for complete search history.

(56) References Cited

U.S. PATENT DOCUMENTS

| | | | |
|---|---|---|---|
| 7,049,990 B2 * | 5/2006 | Ranganathan | 341/143 |
| 7,375,666 B2 * | 5/2008 | Melanson | 341/143 |
| 2004/0178937 A1 * | 9/2004 | Okuda et al. | 341/143 |
| 2008/0062022 A1 * | 3/2008 | Melanson | 341/143 |
| 2008/0272944 A1 * | 11/2008 | Zhou et al. | 341/143 |

OTHER PUBLICATIONS

W. Yang et al., "A 100mW 10MHz-BW CT ΔΣ Modulator with 87dB DR and 91dBc IMD," 2008 IEEE ISSCC, Session 27, ΔΣ Data Converters / 27.6, pp. 498-499, 631.

* cited by examiner

*Primary Examiner* — Jean B Jeanglaude
(74) *Attorney, Agent, or Firm* — Rader, Fishman & Grauer PLLC

(57) ABSTRACT

A delta-sigma modulator is disclosed herein. By way of example, the delta-sigma modulator includes a plurality of integrators configured to be connected in cascade to the input of an analog signal, a quantifier configured to quantify an output signal from the final-stage integrator among the plurality of integrators so as to output a digital signal, a zero-order feedback path configured to compensate for an internal loop delay in the output of the quantifier, and a voltage output type digital-analog converter configured to be located on the zero-order feedback path and to convert the output digital signal from the quantifier into an analog signal, wherein the voltage output type digital-analog converter is connected to the final-stage integrator via a capacitor, and the voltage output type digital-analog converter switches an output amplitude in accordance with a calibration code that is supplied.

14 Claims, 17 Drawing Sheets

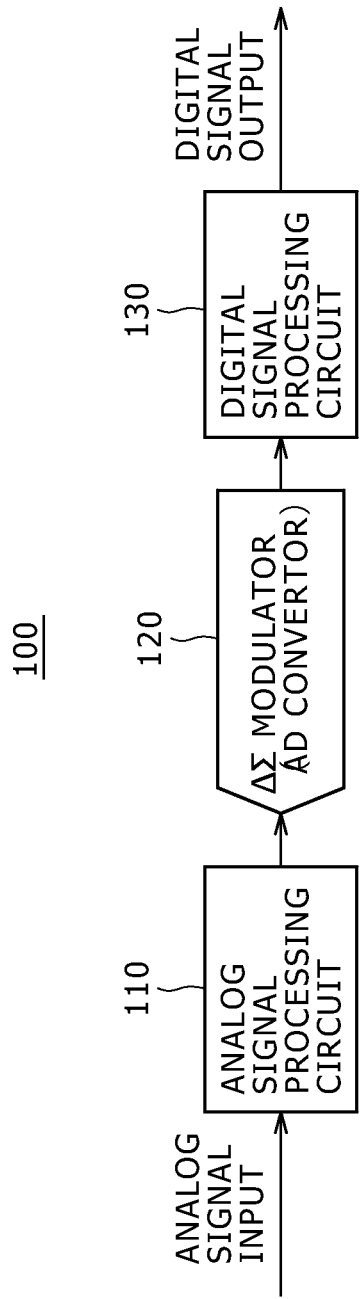

DELTA-SIGMA MODULATOR AND SIGNAL PROCESSING SYSTEM

BACKGROUND

The present disclosure relates in general to receivers for wireless communication and in particular to a continuous-time delta-sigma modulator and a signal processing system applied to audio equipment and medical measuring instruments.

FIG. 1 shows a basic structure of a delta-sigma modulator.

The delta-sigma modulator 1 in FIG. 1 is made up of a filter FLT, a quantifier Quan, and a digital-analog converter DAC1.

The delta-sigma modulator 1 constitutes a feedback modulator that includes a digital-analog (DA) converter DAC1 and a filter FLT for filtering the quantification noise generated by the quantifier Quan within a signal band (i.e., a band frequency lower than the sampling frequency of the quantifier) in order to improve signal-to-noise ratio (SNR).

If the filter FLT is a continuous-time type, the modulator acts as a continuous-time delta-sigma modulator; if the filter FLT is a discrete-time type, the modulator serves as a discrete-time delta-sigma modulator. The filter FLT is designed to have a high gain within the signal band so as to balance quantization noise attenuation with stability.

FIG. 2 shows a typical structure of a delta-sigma modulator having a zero-order feedback path.

In the continuous-time delta-sigma modulator, a delay in a feedback signal caused by the quantifier Quan and digital-analog converter DAC1 is called an excess loop delay (ELD). This delay, if taking place, can degrade primarily the stability of the delta-sigma modulator.

In order to avoid destabilization, the zero-order feedback path Path$_0$ including a digital-analog converter DAC0 and a weight $k_0$ is generally added as shown in FIG. 2. This technique is used to make up for the signal delay attributable to the loop delay (ELD) and to reinforce stability.

FIGS. 3 and 4 are block diagrams showing typical structures of ordinary continuous-time 3rd-order delta-sigma modulators. The delta-sigma modulator 1B in FIG. 3 is called a feedback modulator, and the delta-sigma modulator 1C in FIG. 4 is called a feed-forward modulator. Each of the modulators is furnished with the zero-order feedback path Path$_0$.

It should be noted that where an adder is positioned upstream of an integrator such as an adder ADD1 and an integrator INT1 in FIG. 3, both are generally formed as integral parts when made into a circuit.

On the other hand, where an adder or adders are followed immediately downstream by a quantifier such as an adder ADDQ in FIG. 3 or adders ADD1 and ADDQ in FIG. 4 followed immediately downstream by a quantifier Quan, it is difficult to form these parts integrally.

If the modulator is implemented using an analog adder such as one shown in FIG. 5 (ANLADD) having an operational transconductance amplifier (OTA) 1 and resistive elements R1, R2 and Radd, the circuit scale and power consumption can grow.

Thus if a filter FLT2D is structured using a differentiator DIFF1 as shown in FIG. 6, the adder ADD1 in FIG. 4 can be moved to immediately upstream of a final-stage integrator INT3 (i.e., input side of the integrator INT3) without change in the filter characteristics.

The adder ADDQ immediately upstream of the remaining quantifier Quan is needed to additionally provide the zero-order feedback path Path$_0$. This adder, too, can be moved to immediately upstream of the final-stage integrator INT3 using the differentiator likewise.

FIGS. 7 and 8 show typical structures of the modulators without the adder positioned upstream of the quantifier as indicated in FIGS. 3 and 6.

FIG. 7 shows a typical structure of a feedback type continuous-time 3rd-order delta-sigma modulator that eliminates the adder upstream of the quantifier.

FIG. 8 shows a typical structure of a feed-forward type continuous-time 3rd-order delta-sigma modulator that also eliminates the adder upstream of the quantifier.

FIG. 9 shows how to implement an adder ADD1, an integrator INT3, differentiators DIFF0 and DIFF1, and weights $k_0, k_1, k_2$ and $k_3$ making up a portion of the modulator in FIG. 8.

The portion in FIG. 8 that contains the adder ADD1, integrator INT3, differentiators DIFF0 and DIFF1, and weights $k_0, k_1, k_2$ and $k_3$ is shown implemented by a circuit 2 in FIG. 9 including an operational transconductance amplifier OTA, resistive elements $R_{k2}$ and $R_{k3}$, and capacitors $C_{k0}, C_{k1}$ and $C_{int3}$.

In the circuit 2 of FIG. 9, the integral capacitor $C_{int3}$ is charged with the current flowing through the resistive elements $R_{k2}$ and $R_{k3}$ in a manner corresponding to input voltages $V_2$ and $V_3$, whereby the integral action is implemented.

Meanwhile, the differentiators DIFF0 and DIFF1 in FIG. 8 are implemented using the capacitors $C_{k0}$ and $C_{k1}$ instead of resistors.

A digital-analog converter DAC0 in FIG. 8 is a line-voltage output type. If the delta-sigma modulator is implemented as a multi-bit output type and the digital-analog converter DAC0 as a parallel DAC arrangement for outputting one LSB, then the capacitor $C_{k0}$ in FIG. 9 is arrayed in parallel as well.

The input/output relational expression applicable to the circuit in FIG. 9 is given by the following expression:

$$V_{out} = \frac{C_{k1}}{C_{int3}} \cdot V_1 + \frac{1}{sR_{k2}C_{int3}} \cdot V_2 + \frac{1}{sR_{k3}C_{int3}} \cdot V_3 + \frac{C_{k0}}{C_{int3}} \cdot VDACout < 1 > \quad (1)$$

As can be seen from the expression (1) above, differentiators and integrators constituting a path cancel one another out so that the gain of the path is expressed by a capacity ratio.

Since the variations of the elements of one type within a chip (local variations) are generally smaller than the variations between chips (global variations), the gain determined by the capacity ratio may be implemented with high accuracy.

In this connection, the reader is asked to refer to W. Yang, W. Schofield, H. Shibata, S. Korrapati, A. Shaikh, N. Abaskharoun, D. Ribner, "A 100 mW 10 MHz-BW CT ΔΣ Modulator with 87 dB DR and 91 dBc IMD," ISSCC Dig. Tech. Papers, pp. 498-499. February 2008 (called the Non-Patent Document 1 hereunder).

SUMMARY

However, the second and the third terms of the expression (1) above have the gain of their integration path determined by the reciprocal number of the product of the resistance and capacitance involved. Given that different elements are combined, the variations in gain between chips are considerable.

The same can be said not only of the portion shown in FIG. 9 but also of all integrators. The variations in gain between the integrators also entail significant variations in filter characteristics. That in turn can more likely lead to degradation in the stability and quantization noise attenuation characteristic of the delta-sigma modulator.

In order to correct the adverse effects of the variations between chips and obtain a desired integrator gain, it is generally necessary to perform calibration for adjusting resistance and capacity values.

Because the variations between chips are substantially similar to those between elements of the same type, the multiplying factor of the adjustment is the same for both cases. Thus it is common practice to distribute to each of the elements the same calibration code as the switch setting for implementing the adjustment.

There may be choices to be made in terms of where to adjust the circuit through such calibration.

Structure for Adjusting Capacitance

FIG. 10 is a circuit diagram corresponding to the block diagram of FIG. 8, the circuit diagram showing a typical structure for adjusting all capacitors through calibration.

To adjust the gain of integrators INT, either their resistance value or their capacity value may be adjusted. Frequently, it is the capacity value that is adjusted and not the resistance value.

The preference for adjusting the capacity value is twofold: it is easy to generate the reference current for a digital-analog converter IDAC1 in reference to the resistance value, and changing the resistance value with switches can be easily affected by switch-on resistance or by their nonlinearity.

In such a case, the capacity value of the capacitor $C_{k0}$ of the zero-order feedback path tends to be reduced. Thus if the capacity value is arranged to be changed with switches, the parasitic capacity of the switches can affect the gain and frequency characteristic of the zero-order feedback path, which tends to degrade the stability of the delta-sigma modulator.

Since the capacitors $C_{k0}$ are arrayed in parallel in a multi-bit output delta-sigma modulator as shown in FIG. 9, there are numerous elements that need to be switched in that modulator. This can result in an enlarged circuit scale.

In order to avoid bloated circuitry, the capacitor $C_0$ alone of the zero-order feedback path may be left uncalibrated. However, this arrangement also falls short of ensuring stability from a yield point of view.

For these reasons, if large margins are allowed for stability, it is generally necessary to reach a trade-off between a lowered SNR and an enlarged circuit scale or increased consumption current of the delta-sigma modulator.

FIG. 11 is a circuit diagram showing an example in which the resistance value of the final-stage integrator alone is adjusted using the calibration disclosed in the above-cited Non-Patent Document 1.

The circuit in FIG. 11 is one in which only the final-stage integrator has its resistance value adjusted so as to avert the problem discussed above in reference to FIG. 10. In the case of a 3rd-order delta-sigma modulator, the corresponding circuit may be such as is shown in FIG. 12.

In this case, there is no need to switch the capacitor $C_{k0}$ of the zero-order feedback path, but there occurs a growing effect of switch-on resistance. If the order of the delta-sigma modulator is high, there can be numerous elements that need to be switched.

Under these circumstances, there has been a strong need for a calibration structure that maintains the stability of the delta-sigma modulator with little increase in the scale of circuitry, power consumption, and distortion.

The present disclosure thus envisages providing a delta-sigma modulator and a signal processing system for implementing a calibration structure that maintains the stability of the delta-sigma modulator without increasing its circuit scale, power consumption and distortion.

According to one embodiment of the present disclosure, there is provided a delta-sigma modulator including: a plurality of integrators configured to be connected in cascade to the input of an analog signal; a quantifier configured to quantify an output signal from the final-stage integrator among the plurality of integrators so as to output a digital signal; a zero-order feedback path configured to compensate for an internal loop delay in the output of the quantifier; and a voltage output type digital-analog converter configured to be located on the zero-order feedback path and to convert the output digital signal from the quantifier into an analog signal. In the delta-sigma modulator, the voltage output type digital-analog converter is connected in capacity to the final-stage integrator and switches an output amplitude in accordance with a calibration code that is supplied.

According to another embodiment of the present disclosure, there is provided a signal processing system including a delta-sigma modulator having an analog-digital conversion function for converting an analog signal from an analog signal processing system into a digital signal. The delta-sigma modulator includes: a plurality of integrators configured to be connected in cascade to the input of the analog signal; a quantifier configured to quantify an output signal from the final-stage integrator among the plurality of integrators so as to output the digital signal; a zero-order feedback path configured to compensate for an internal loop delay in the output of the quantifier; and a voltage output type digital-analog converter configured to be located on the zero-order feedback path and to convert the output digital signal from the quantifier into the analog signal. The voltage output type digital-analog converter is connected in capacity to the final-stage integrator and switches an output amplitude in accordance with a calibration code that is supplied.

According to the present disclosure embodied as outlined above, it is possible to implement a calibration structure that maintains the stability of the delta-sigma modulator without increasing its circuit scale, power consumption and distortion.

BRIEF DESCRIPTION OF THE DRAWINGS

Further features and advantages of the present disclosure will become apparent upon a reading of the following description and appended drawings in which:

FIG. 20 is a block diagram showing a typical structure of a signal processing system constituting a fifth embodiment of the present disclosure.

DETAILED DESCRIPTION OF THE PREFERRED EMBODIMENTS

Some preferred embodiments of the present disclosure will now be described below in reference to the accompanying drawings. The description will be given under the following headings:

1. First embodiment;
2. Second embodiment;
3. Third embodiment;
4. Fourth embodiment; and
5. Fifth embodiment.

1. First Embodiment

First Overall Structure of the Delta-Sigma Modulator

Figure 13:
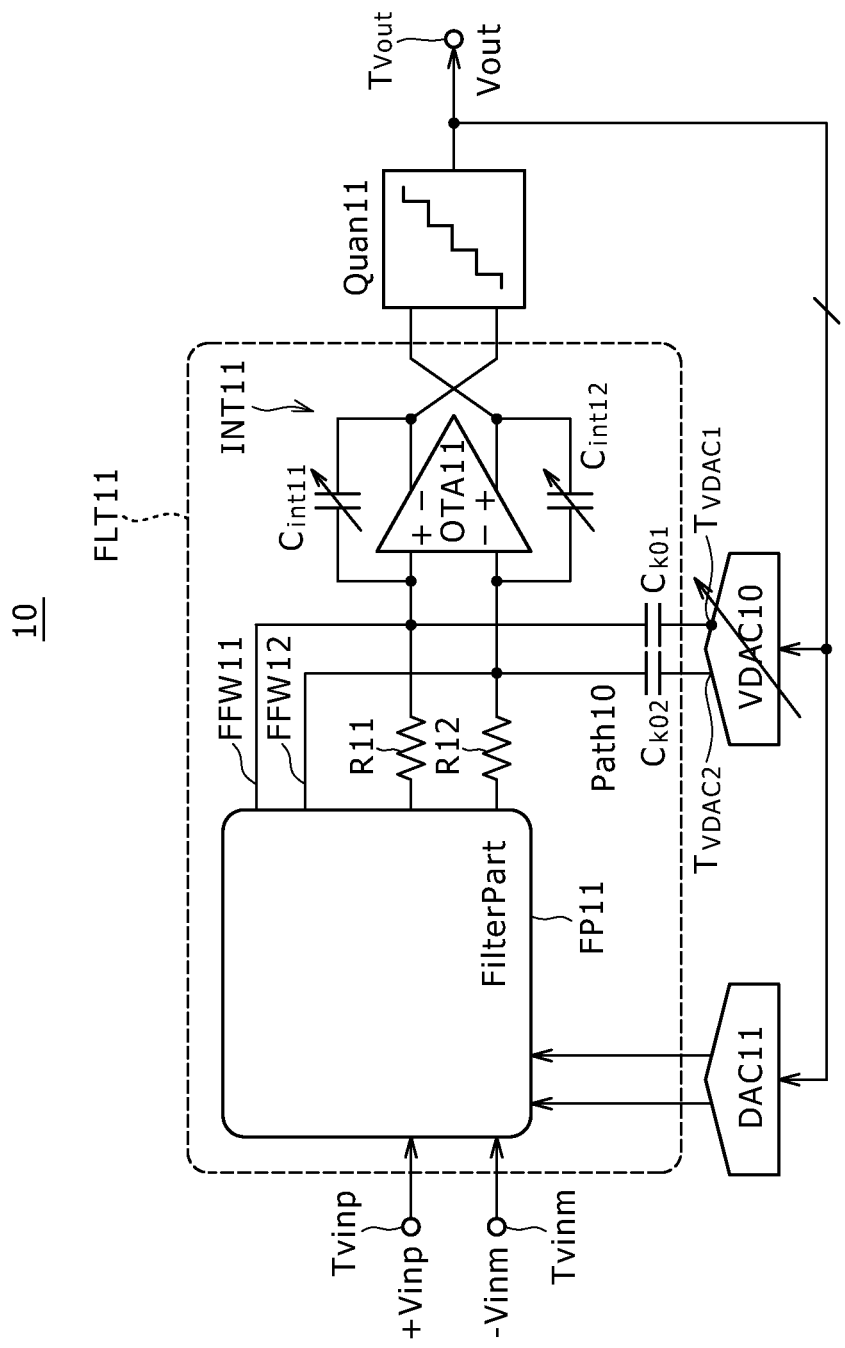
FIG. 13 is a circuit diagram showing an overall structure of a delta-sigma modulator which constitutes a first embodiment of the present disclosure and which includes a calibration function.

FIG. 13 is a circuit diagram showing an overall structure of a delta-sigma modulator 10 which constitutes the first embodiment of the present disclosure and which includes a calibration function.

As shown in FIG. 13, the delta-sigma modulator 10 making up the first embodiment has a filter FLT11, a quantifier Quan11, a voltage output type digital-analog converter VDAC10 constituting a compensation portion, and a digital-analog converter DAC11 for feedback to the input side.

The delta-sigma modulator 10 in FIG. 13 is structured as a circuit that receives a differential input signal.

In FIG. 13, reference character $V_{inp}$ stands for a positive (+) analog input signal, $V_{inm}$ for a negative (−) analog signal, and $V_{out}$ for a digital output signal.

The delta-sigma modulator 10 is furnished with a first analog signal input terminal $T_{Vinp}$, a second analog signal input terminal $T_{Vinm}$, and an output terminal $T_{Vout}$, as shown in FIG. 13.

The filter FLT11 has a first integrator INT11 as the final-stage integrator positioned immediately upstream of the quantifier Quan11, a filter part FP11 including at least one integrator, and resistors R11 and R12 connected to the output of the filter part FP11.

Also, the structure in FIG. 13 has feed-forward paths FFW11 and FFW12 applicable to the feed-forward modulator.

The technique disclosed herein may be applied not only to the feed-forward modulator but also to the feedback type, as will be discussed later.

The first integrator INT11 has an operational amplifier OTA11 for handling differential input/output, and capacitors $C_{int11}$ and $C_{int12}$.

The operational amplifier OTA11 has its positive input terminal (uninverted input terminal +) and its negative input terminal (inverted input terminal −) connected to the resistors R11 and R12, respectively.

The operational amplifier OTA11 has its positive output terminal and its negative output terminal connected to the positive input terminal and the negative input terminal of the quantifier Quan11, respectively.

And a capacitor $C_{int11}$ is connected between the negative output terminal and the positive input terminal of the operational amplifier OTA11.

A capacitor $C_{int12}$ is connected between the positive output terminal and the negative input terminal of the operational amplifier OTA11.

The filter FP11, which is the remaining part of the filter FLT11 in FIG. 13, may be structured in any appropriate way desired. For example, the gains of the integrators inside may all be calibrated through integral capacity switching. Alternatively, the gains may be calibrated through resistor switching.

In the delta-sigma modulator 10, the output of the quantifier Quan11 is connected to the output terminal $T_{Vout}$ of a digital signal. The digital signal is fed back to the voltage output type digital-analog converter VDAC10 and to the digital-analog converter DAC11.

The delta-sigma modulator 10 is formed as a continuous-time delta-sigma modulator that has a zero-order feedback path Path10 for compensating for the deterioration in stability due to a feedback loop delay (excess loop delay). The voltage output type digital-analog converter VDAC10 is connected to the zero-order feedback path Path10.

The delta-sigma modulator 10 is formed as a continuous-time delta-sigma modulator that implements the zero-order feedback path Path10 through capacity coupling of the final-stage first integrator INT11 with the voltage output type digital-analog converter VDAC10.

That is, a capacitor $C_{k01}$ is connected between a first output terminal $T_{VDAC1}$ of the voltage output type digital-analog converter VDAC10 on the one hand, and the positive input terminal of the operational amplifier OTA11 constituting part of the first integrator INT11 on the other hand.

Likewise, a capacitor $C_{k02}$ is connected between a second output terminal $T_{VDAC2}$ of the voltage output type digital-analog converter VDAC10 on the one hand, and the negative input terminal of the operational amplifier OTA11 constituting part of the first integrator INT11 on the other hand.

The capacity value of the zero-order feedback path Path10 tends to become smaller. For this reason, if the capacity value of the path is switched to calibrate the delta-sigma modulator 10 in terms of filter characteristic variations, the parasitic capacity of the switches involved and the switch-on resistance can degrade such characteristics of the delta-sigma modulator as stability and peak gain.

Thus with the delta-sigma modulator 10 of the first embodiment, the capacity value of the zero-order feedback path Path10 is not switched. This modulator 10 switches the output amplitude of the voltage output type digital-analog converter VDAC10 instead.

Thus in the final-stage first integrator INT11 of the delta-sigma modulator 10, the resistance R is not switched in place of the capacity value $C_{k0}$ and integral capacity $C_{int}$. Instead, the integral capacity $C_{int}$ and the output range of the voltage output type digital-analog converter VDAC10 are switched for the purpose.

In the expression (2) given below, it is assumed that Δ represents the rate at which the capacity value is adjusted through calibration. As indicated by the expression (2), multiplying the output range of the voltage output type digital-analog converter VDAC10 by (1+Δ) provides substantially the same effect as multiplying the values of the capacitors $C_{k01}$ and $C_{k02}$ by (1+Δ).

Since the multiplying factor is the same for both cases above, the calibration code for capacity switching may be used unmodified for the switching of the voltage output type digital-analog converter VDAC10 provided circuit design is appropriate.

$$VDACout \bigg/ \frac{1}{sC_{k0} \cdot (1+\Delta)} = \{VDACout \cdot (1+\Delta)\} \bigg/ \frac{1}{sC_{k0}} \quad (2)$$

Figure 14:
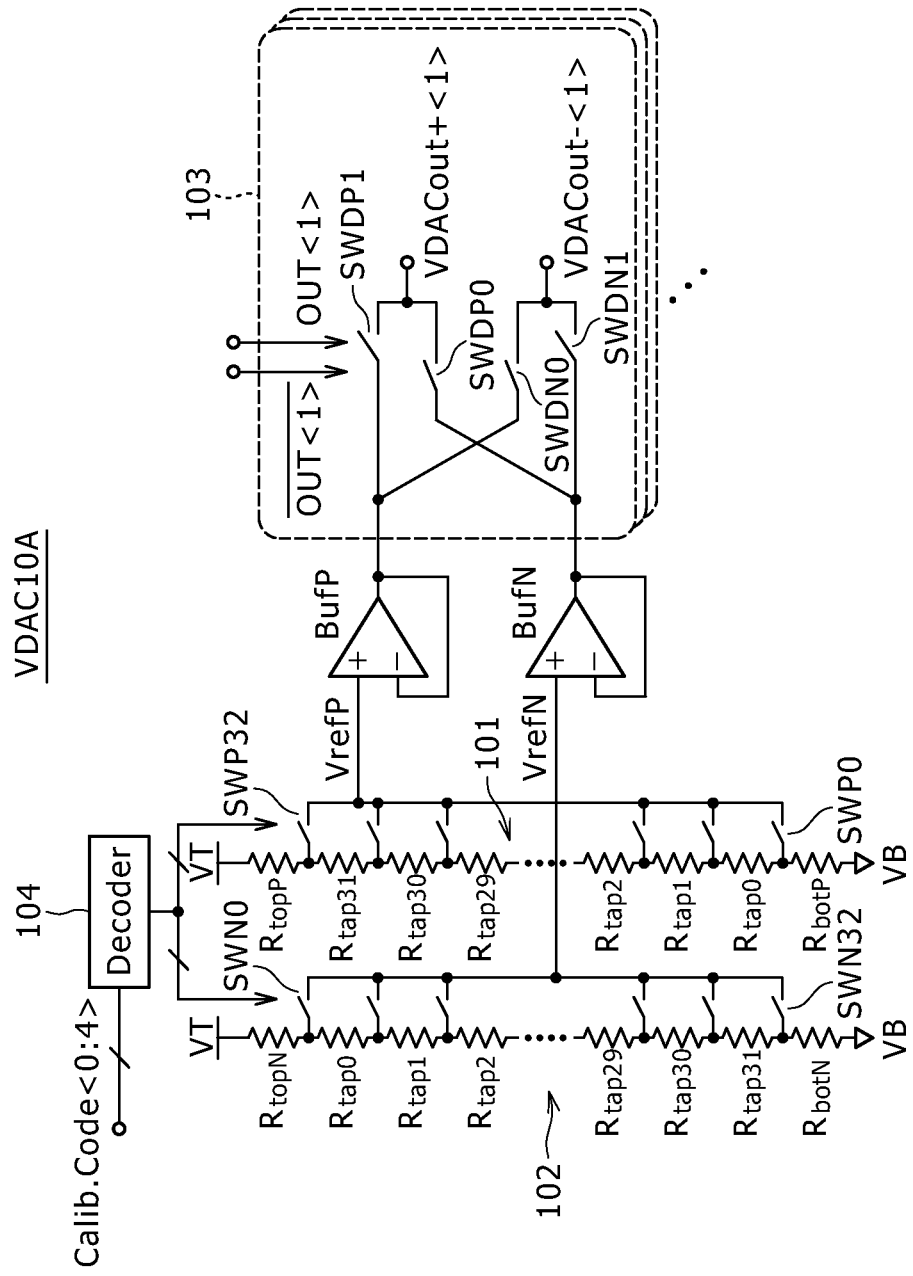
FIG. 14 is a circuit diagram showing a typical structure of an output range variable digital-analog converter for calibration purposes.

FIG. 14 is a circuit diagram showing a typical five-bit structure of an output range variable digital-analog converter for calibration purposes.

A digital-analog converter VDAC10A in FIG. 14 has a first resistance ladder 101, a second resistance ladder 102, analog buffers BufP and BufN, an output part 103, and a decoder 104.

The first resistance ladder 101 has resistors RtopP, Rtap31 through Rtap0 and RbotP connected serially between a power supply VT and a reference potential VB. Switches SWP0 through SWP32 are connected in parallel between the connection points of these resistors on the one hand and the positive input terminal of the analog buffer BufP on the other hand.

The second resistance ladder 102 has resistors RtopN, Rtap0 through Rtap31 and RbotN connected serially between the power supply VT and the reference potential VB. Switches SWN0 through SWN32 are connected in parallel between the connection points of these resistors on the one hand and the positive input terminal of the analog buffer BufN on the other hand.

Depending on the result of decoding by the decoder 104, one of the switches SWP0 through SWP32 and one of the switches SWN0 through SWN32 are controlled to be turned on.

For example, in order to obtain a maximum output, the decoder 104 is supplied with a calibration code Calib.Code such as to turn on the switches SWP32 and SWN32.

The output part 103 has switches SWDP0, SWDP1, SWDN0 and SWDN1.

The switches SWDP0 and SWDN0 are turned on and off simultaneously. Likewise, the switches SWDP1 and SWDN1 are turned on and off simultaneously.

The digital-analog converter VDAC10A has the decoder 104 decode the calibration code Calib.Code coming from a control system, not shown.

The result of the decoding is used to operate the switches in a manner selecting appropriate reference voltages VrefP and VrefN such that the digital-analog converter will have a desired output range.

The reference voltages VrefP and VrefN are allowed to be output from the analog buffers BufP and BufN, respectively. The direction of the voltages is changed in accordance with an output code $V_{out}$ from the delta-sigma modulator 10.

Figure 1:
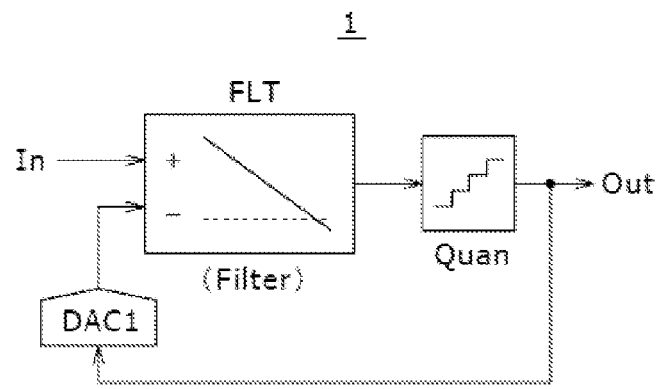
FIG. 1 is a schematic view showing a basic structure of a delta-sigma modulator.
Figure 2:
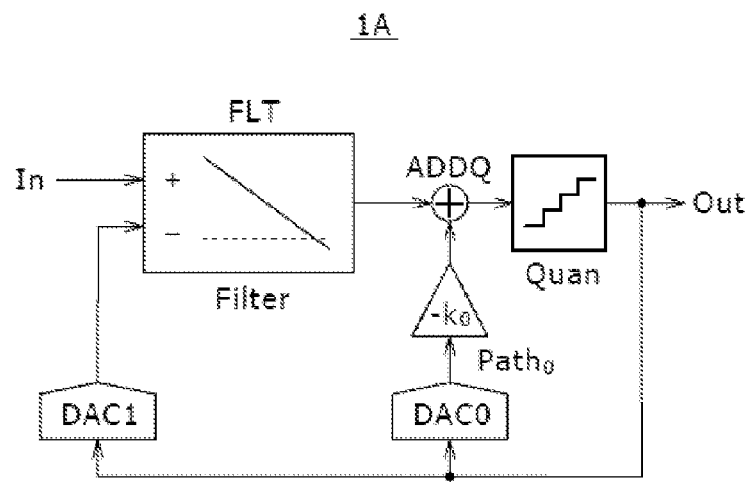
FIG. 2 is a schematic view showing a typical structure of a delta-sigma modulator having a zero-order feedback path.
Figure 3:
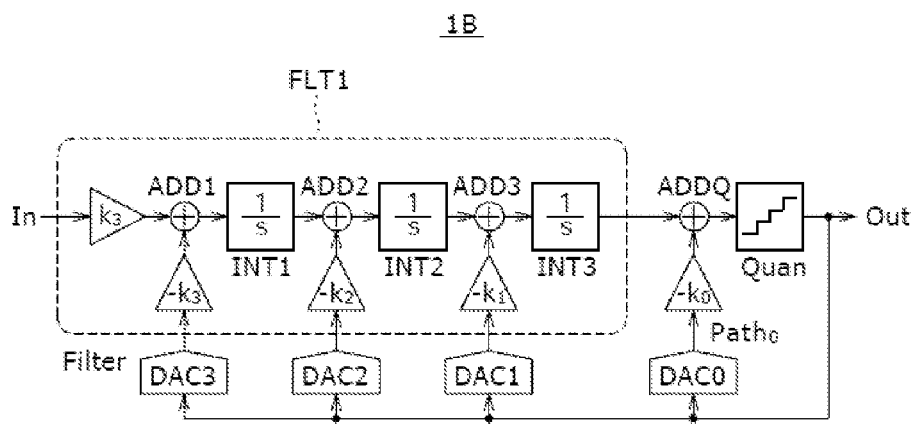
FIG. 3 is a circuit diagram showing an ordinary continuous-time 3rd-order delta-sigma modulator that constitutes a feedback delta-sigma modulator.
Figure 4:
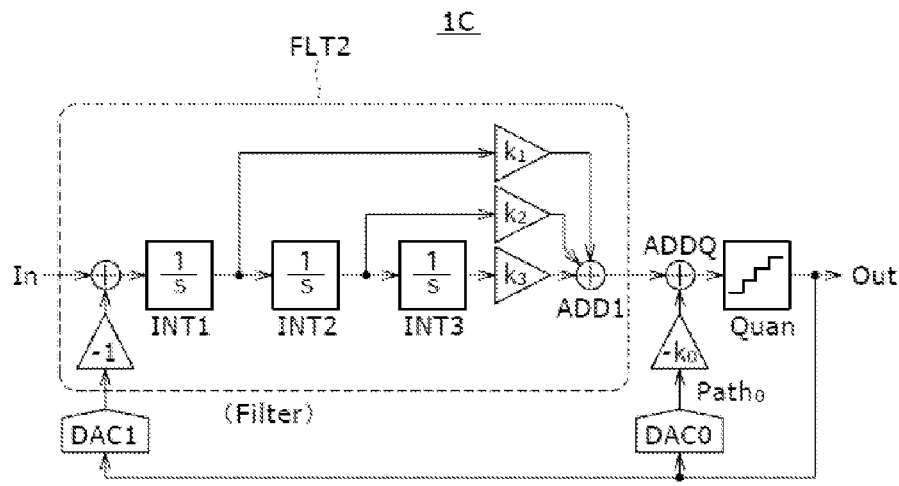
FIG. 4 is a circuit diagram showing an ordinary continuous-time 3rd-order delta-sigma modulator that constitutes a feed-forward delta-sigma modulator.
Figure 5:
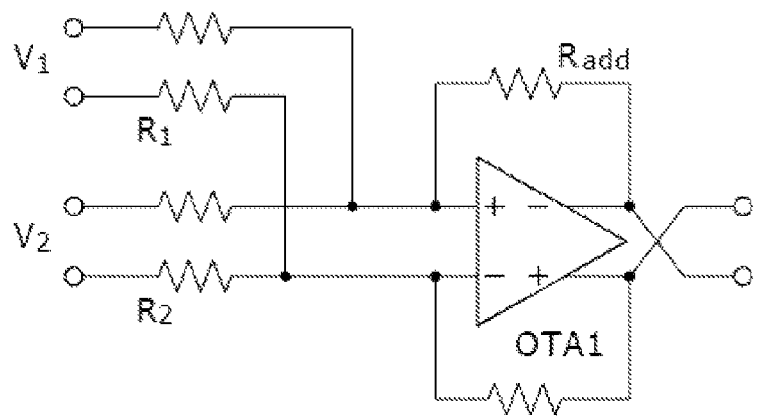
FIG. 5 is a circuit diagram showing an ordinary continuous-time analog adder.
Figure 6:
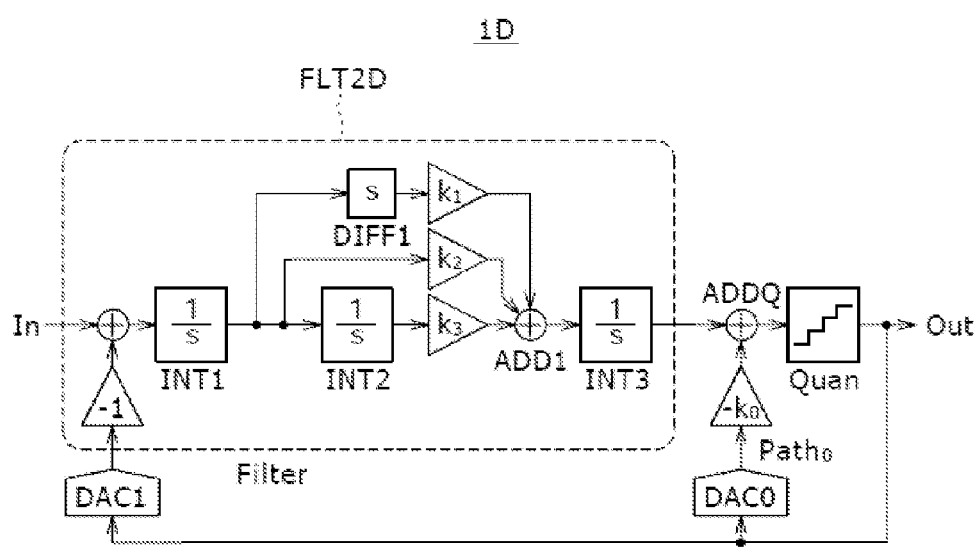
FIG. 6 is a circuit diagram showing a typical structure of a feed-forward continuous-time 3rd-order delta-sigma modulator in which an adder is positioned upstream.
Figure 7:
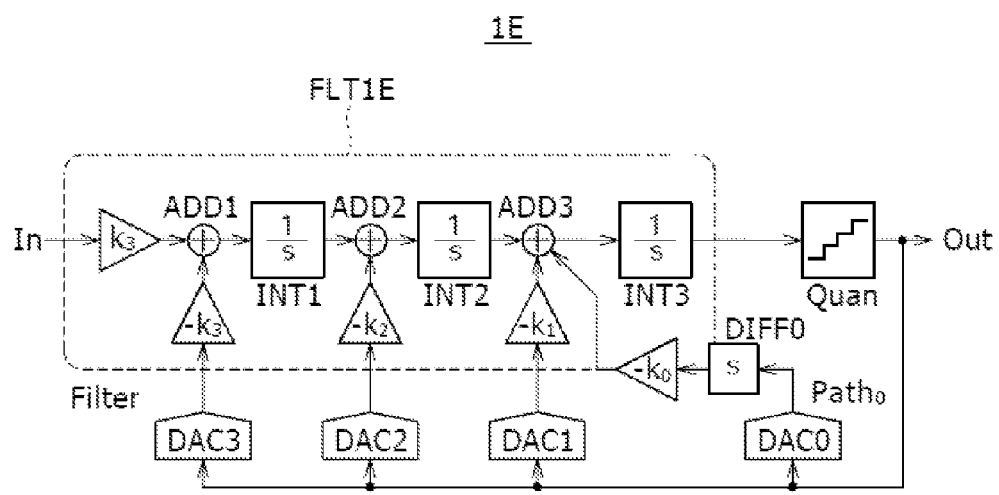
FIG. 7 is a circuit diagram showing a typical structure of a feedback continuous-time 3rd-order delta-sigma modulator with no adder upstream of the quantifier.
Figure 8:
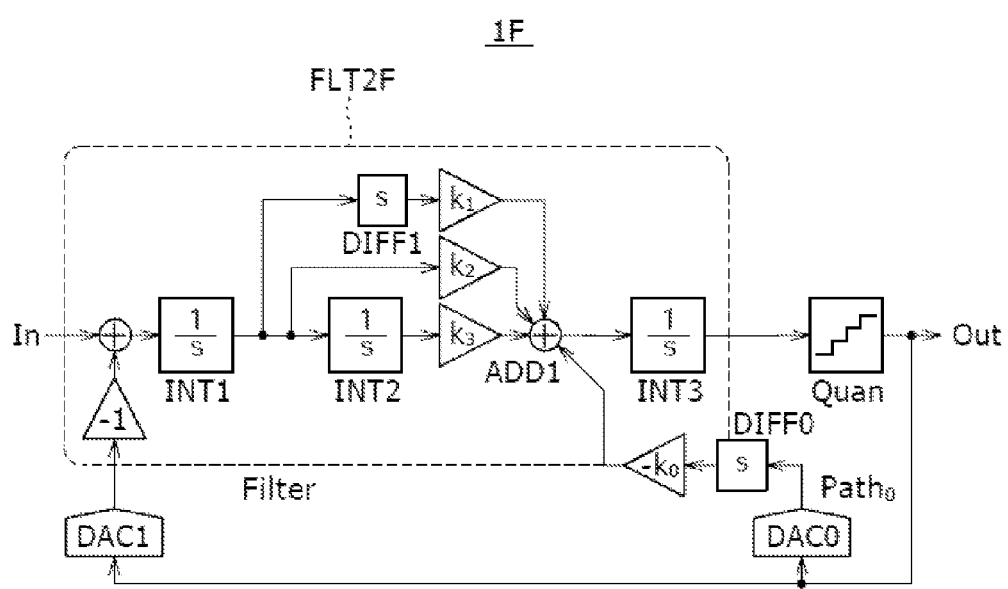
FIG. 8 is a circuit diagram showing a typical structure of a feed-forward continuous-time 3rd-order delta-sigma modulator with no adder upstream of the quantifier.
Figure 9:
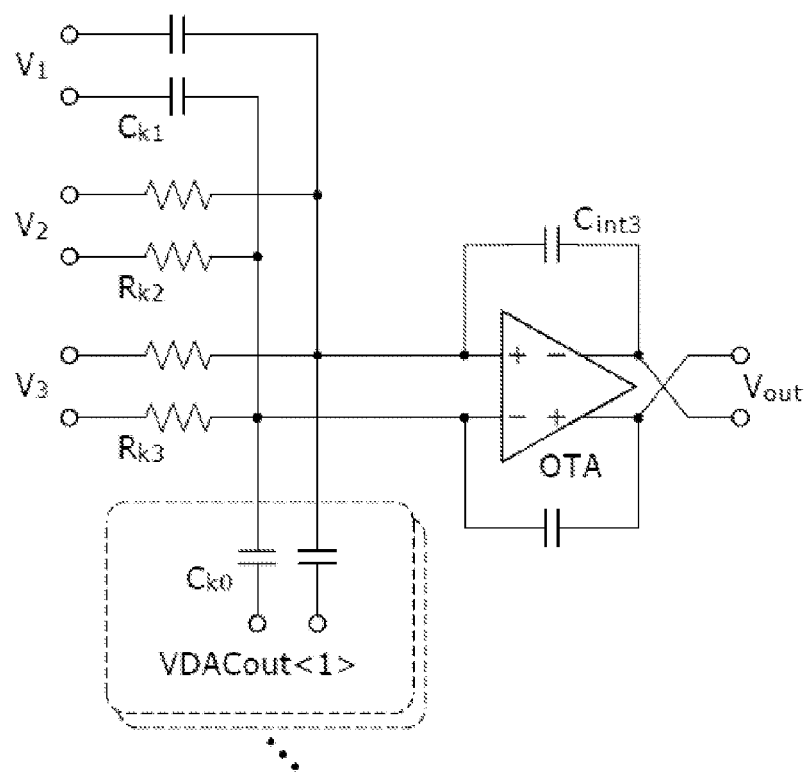
FIG. 9 is a schematic view showing how to implement an adder ADD1, an integrator INT3, differentiators DIFF0 and DIFF1, and weights $k_0$, $k_1$, $k_2$ and $k_3$ as a portion of the structure in FIG. 8.
Figure 10:
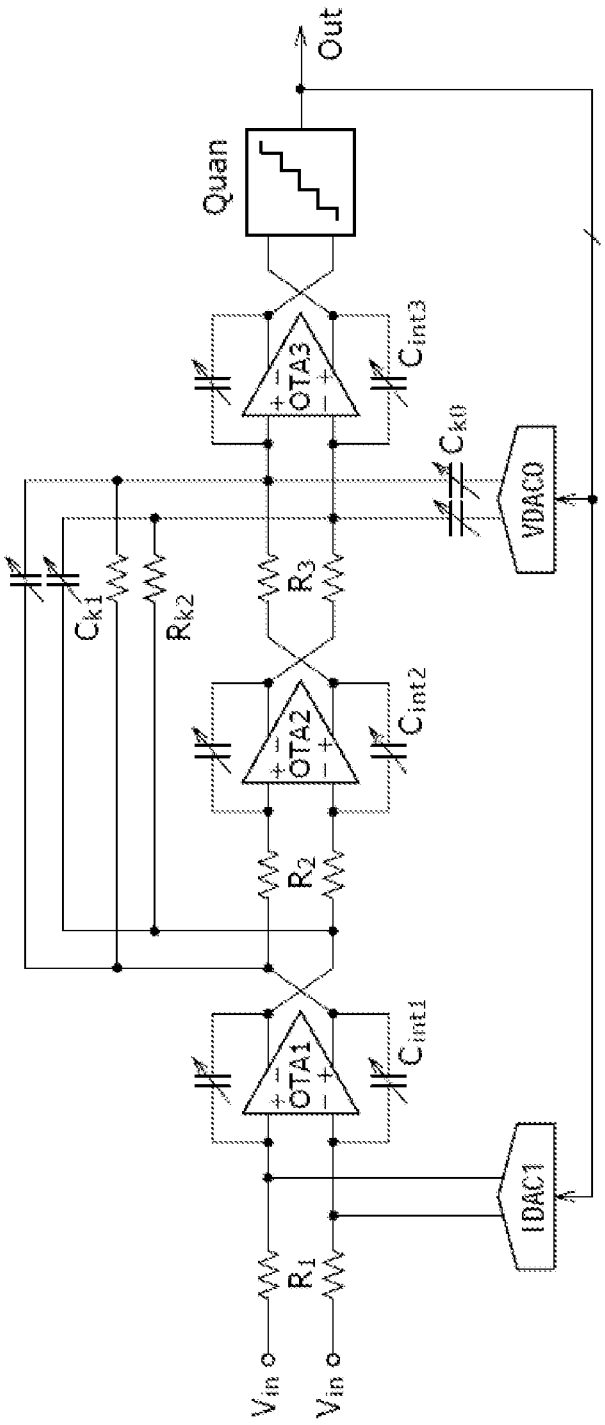
FIG. 10 is a circuit diagram corresponding to the circuit diagram of FIG. 8, the circuit diagram showing a typical structure for adjusting all capacitors through calibration.
Figure 11:
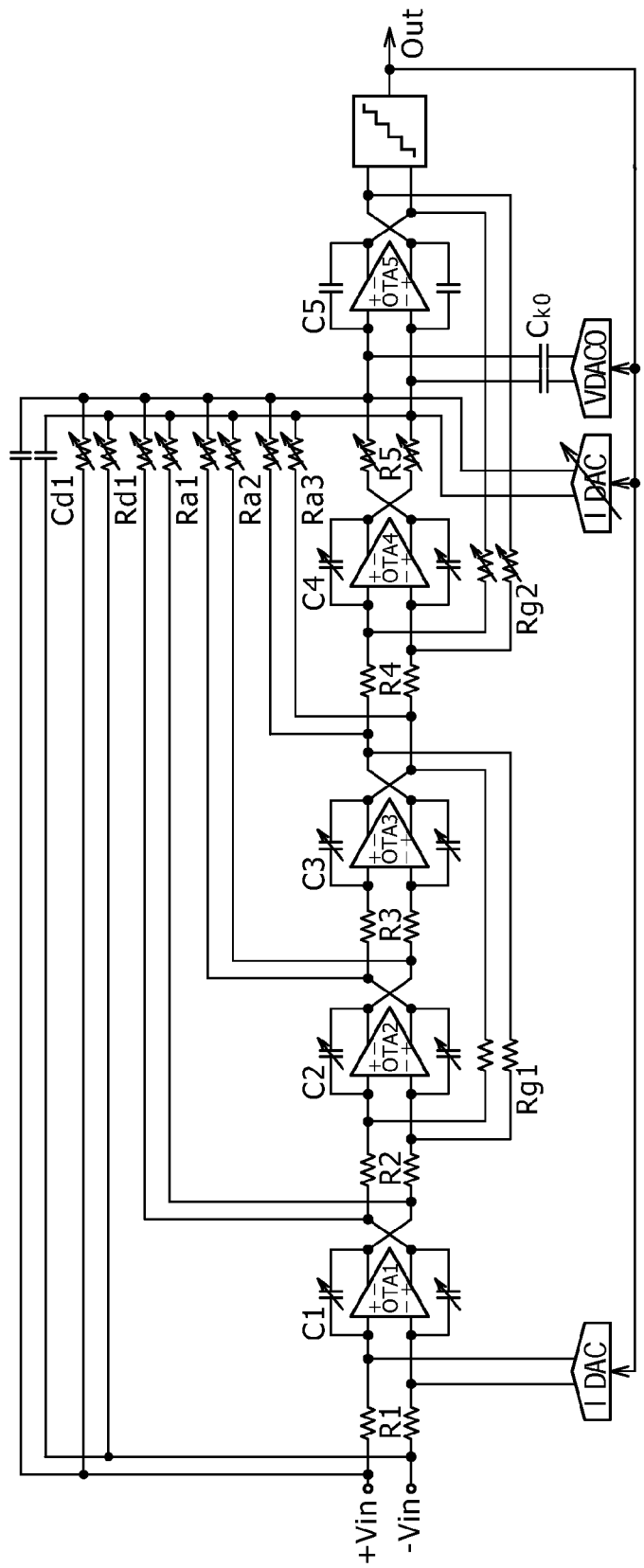
FIG. 11 is a circuit diagram showing a typical structure for adjusting the resistance value of solely the final-stage integrator using the calibration disclosed in the above-cited Non-Patent Document 1.
Figure 12:
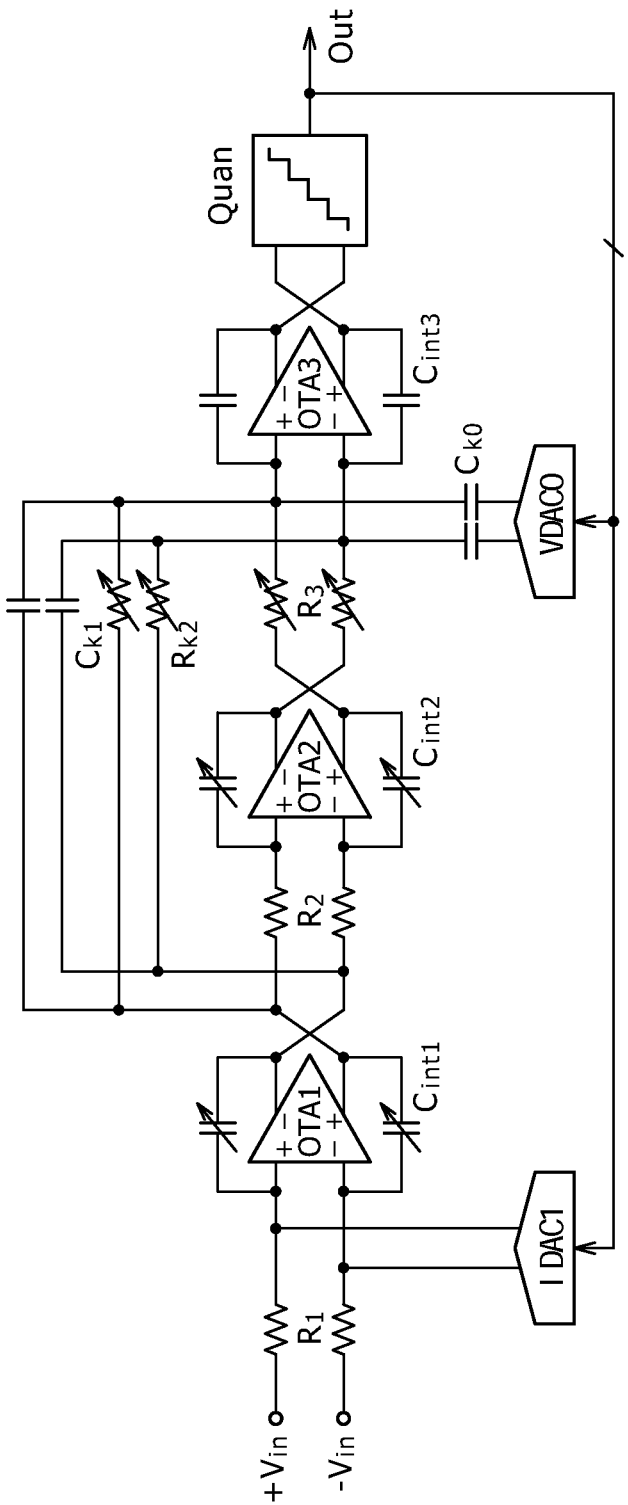
FIG. 12 is a circuit diagram showing a typical structure of a 3rd-order delta-sigma modulator adopting the circuit system of FIG. 11.

As many output parts 103 shown enclosed by broken lines as the number of quantization levels are arrayed in parallel. For example, the output parts 103 may be connected to the capacitor $C_{k0}$ in the circuit of FIG. 9 to implement multi-bit operations.

Figure 15:
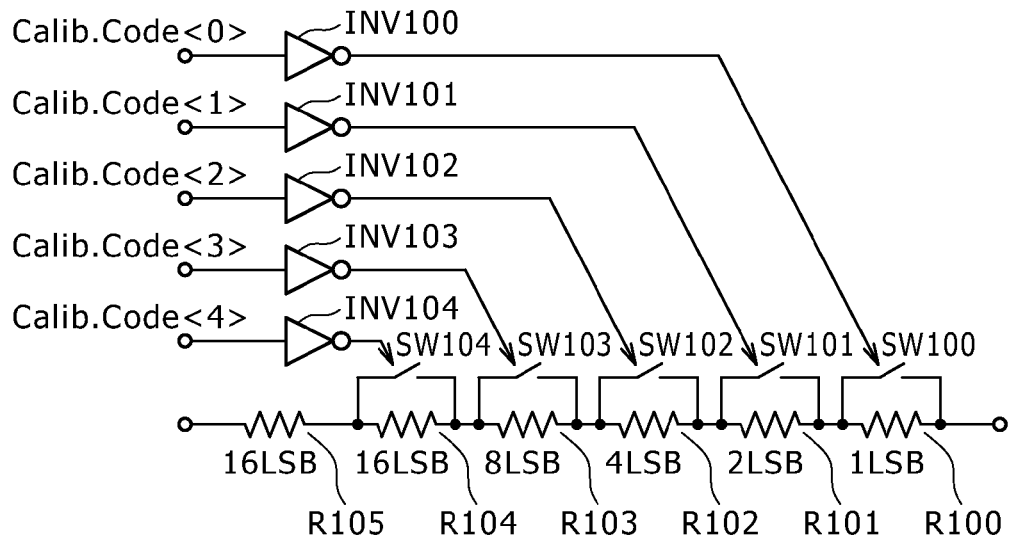
FIG. 15 is a schematic view showing a typical structure of switching resistors for calibration purposes.

FIG. 15 is a schematic view showing a typical structure of switching resistors for calibration purposes.

Figure 16:
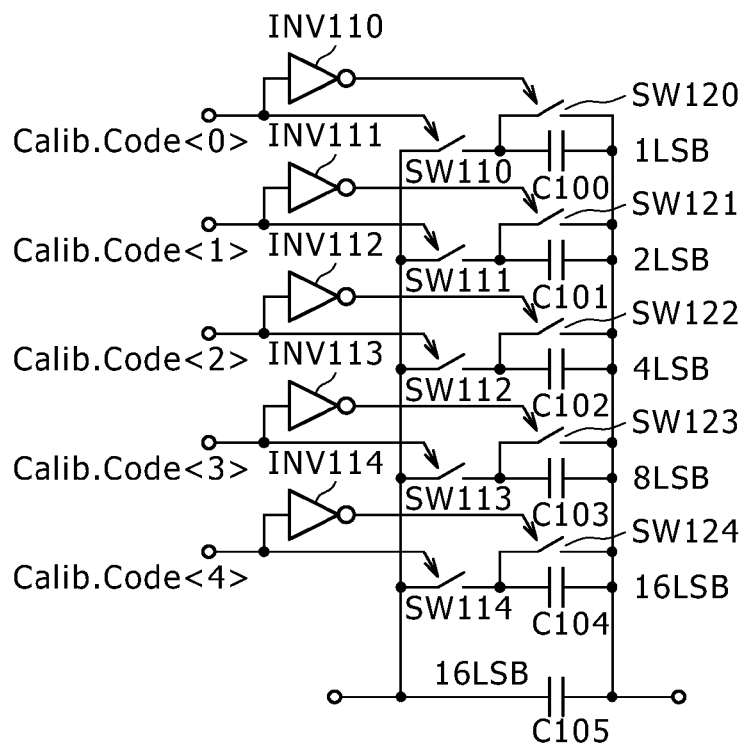
FIG. 16 is a schematic view showing a typical structure of switching capacitors for calibration purposes.

FIG. 16 is a schematic view showing a typical structure of switching capacitors for calibration purposes.

In the circuit of FIG. 15, resistors R100 through R105 are serially connected. Switches SW100 through SW104 are connected in parallel to the resistors R100 through R104.

And calibration codes Calib.Code<0> through Calib.Code<4> are supplied to the switches SW100 through SW104 via inverters INV100 through INV104, respectively. The supplied calibration codes thus switch the resistors.

In the circuit of FIG. 16, capacitors C100 through C105 are connected in parallel. Switches SW110 through SW114 are serially connected to the capacitors C100 through C104, and switches SW120 through SW124 are connected in parallel to the capacitors C100 through C104.

And the calibration codes Calib.Code<0> through Calib.Code<4> are supplied to the switches SW110 through SW114, and are fed to the switches SW120 through SW124 via inverters INV110 through INV114, respectively. The supplied calibration codes cause the capacitors to be switched.

As described, when the reference values of the digital-analog converter VDAC10 are switched, the number of the switching elements inside the filter is reduced. This in turn minimizes the adverse effects of the parasitic resistance and parasitic capacitance of the switches involved.

2. Second Embodiment

Second Overall Structure of the Delta-Sigma Modulator

Figure 17:
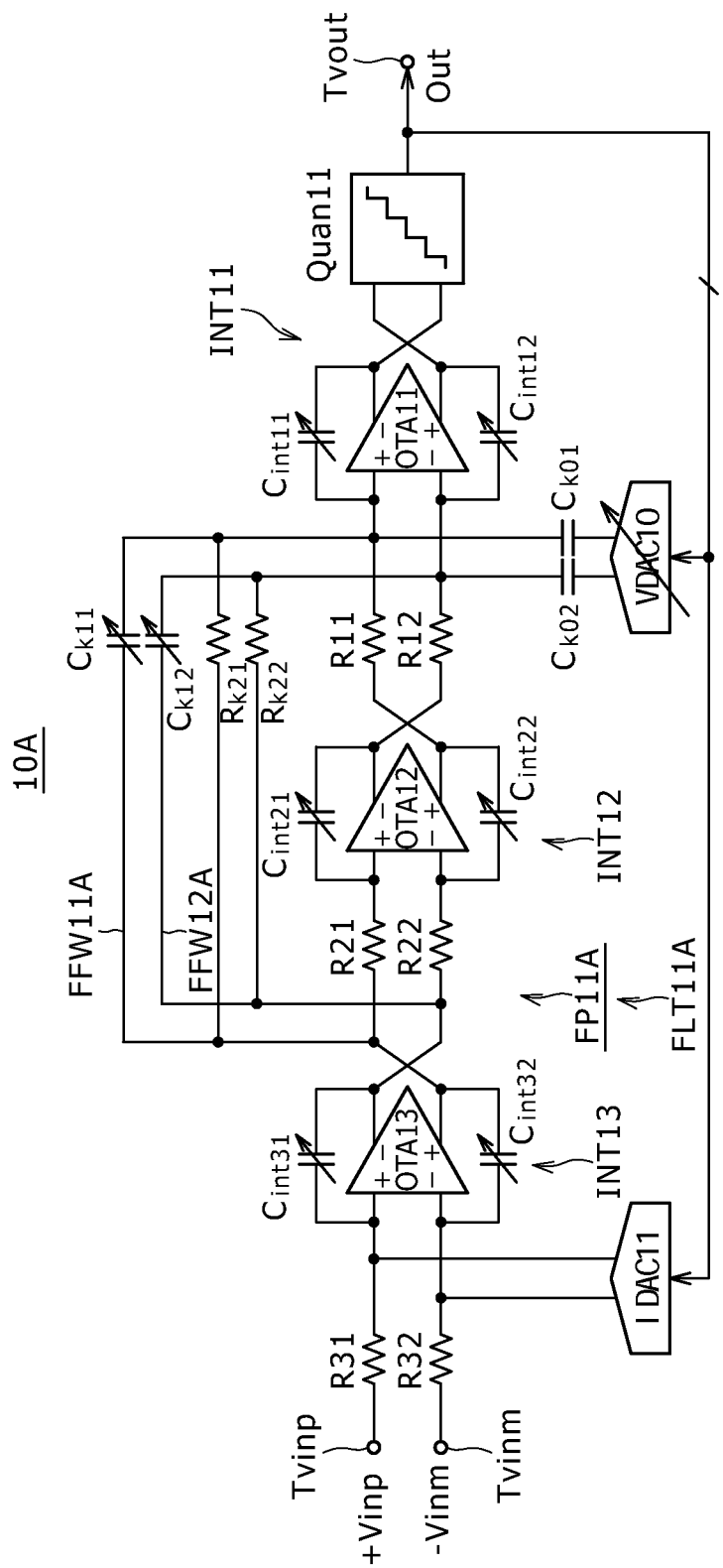
FIG. 17 is a circuit diagram showing an overall structure of a feed-forward continuous-time 3rd-order delta-sigma modulator which constitutes a second embodiment of the present disclosure and which has a feedback path for delay compensation.

FIG. 17 is a circuit diagram showing an overall structure of a feed-forward continuous-time 3rd-order delta-sigma modulator 10A which constitutes the second embodiment of the present disclosure and which has a feedback path for delay compensation.

The major differences between the delta-sigma modulator 10A as the second embodiment and the delta-sigma modulator 10 as the first embodiment are as follows:

In the delta-sigma modulator 10A, a filter part FP11A of a filter FLT11A is structured to include a second integrator INT12, a third integrator INT13, resistors R21 and R22, and input resistors R31 and R32.

And a resistor $R_{k21}$ and a capacitor $C_{k11}$ are connected in parallel to a feed-forward path FFW11A, and a resistor $R_{k22}$ and a capacitor $C_{k12}$ are connected in parallel to a feed-forward path FFW12A.

The second integrator INT12 has an operational amplifier OTA12 for handling differential input/output, and capacitors $C_{int21}$ and $C_{int22}$.

The operational amplifier OTA12 has its positive input terminal (uninverted input terminal +) and its negative input terminal (inverted input terminal −) connected to the resistors R21 and R22, respectively.

The operational amplifier OTA12 has its positive output terminal and its negative output terminal connected to the resistors R11 and R12, respectively.

And the capacitor $C_{int21}$ is connected between the negative output terminal and the positive input terminal of the operational amplifier OTA12.

The capacitor $C_{int22}$ is connected between the positive output terminal and the negative input terminal of the operational amplifier OTA12.

The third integrator INT13 has an operational amplifier OTA13 for handling differential input/output, and capacitors $C_{int31}$ and $C_{int32}$.

The operational amplifier OTA13 has its positive input terminal (uninverted input terminal +) and its negative input terminal (inverted input terminal −) connected to the resistors R31 and R32, respectively.

The operational amplifier OTA13 has its positive output terminal and its negative output terminal connected to the resistors R21 and R22, respectively.

And the capacitor $C_{int31}$ is connected between the negative output terminal and the positive input terminal of the operational amplifier OTA13.

The capacitor $C_{int32}$ is connected between the positive output terminal and the negative input terminal of the operational amplifier OTA13.

The delta-sigma modulator 10A structured as outlined above and shown in FIG. 17 is formed as the continuous-time 3rd-order feed-forward delta-sigma modulator discussed above. The digital-analog converter VDAC10 and capacitors $C_{k01}$ and $C_{k02}$ constitute a feedback path that compensates for the loop delay.

3. Third Embodiment

Third Overall Structure of the Delta-Sigma Modulator

Figure 18:
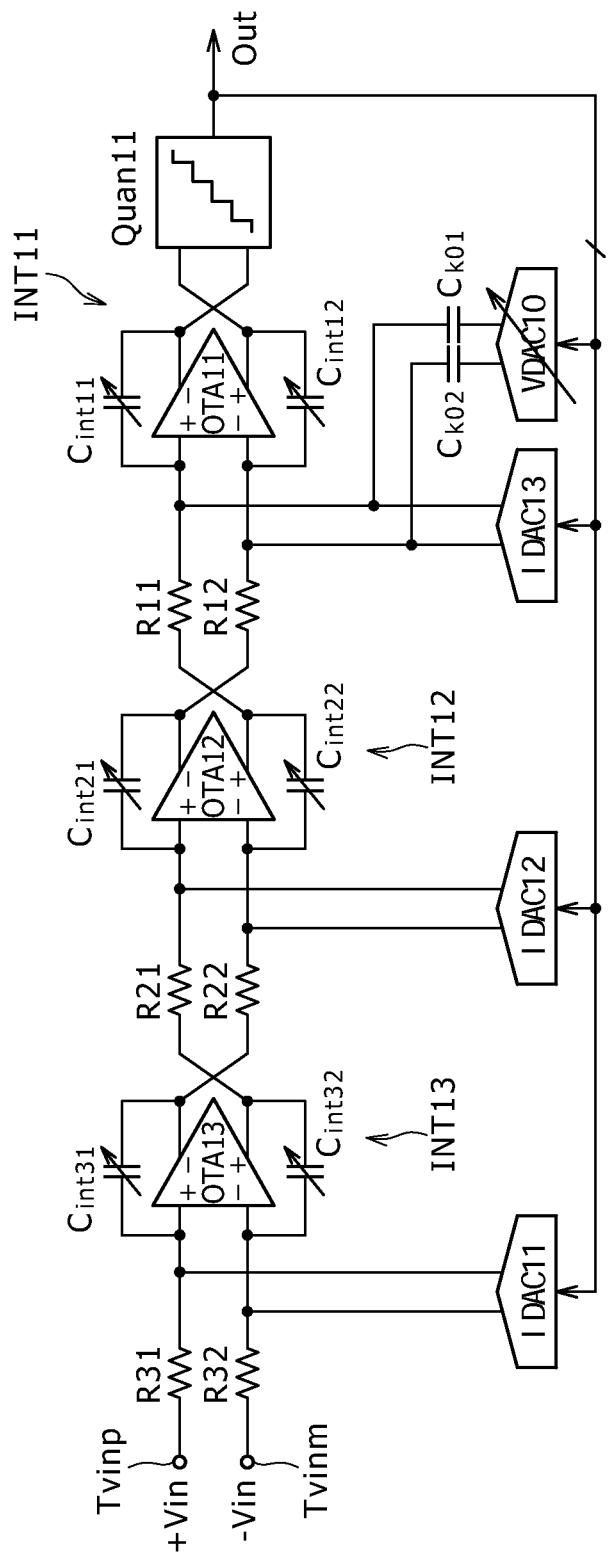
FIG. 18 is a circuit diagram showing an overall structure of a feedback continuous-time 3rd-order delta-sigma modulator which constitutes a third embodiment of the present disclosure and which has a feedback path for delay compensation.

FIG. 18 is a circuit diagram showing an overall structure of a feedback continuous-time 3rd-order delta-sigma modulator 10B which constitutes the third embodiment of the present disclosure and which has a feedback path for delay compensation.

The major difference between the delta-sigma modulator 10B as the third embodiment and the delta-sigma modulator 10A as the second embodiment is that the delta-sigma modulator 10B is structured as a feedback type modulator.

The delta-sigma modulator 10B has no feed-forward path. The delta-sigma modulator 10B is structured to include a digital-analog converter IDAC12 for feedback to the input side of the second integrator INT12 and a digital-analog converter IDAC13 for feedback to the input side of the first integrator INT11.

The delta-sigma modulator 10B structured as outlined above and shown in FIG. 18 is formed as the continuous-time 3rd-order feedback delta-sigma modulator discussed above. The digital-analog converter VDAC10 and capacitors $C_{k01}$ and $C_{k02}$ constitute a feedback path that compensates for the loop delay.

4. Fourth Embodiment

Fourth Overall Structure of the Delta-Sigma Modulator

Figure 19:
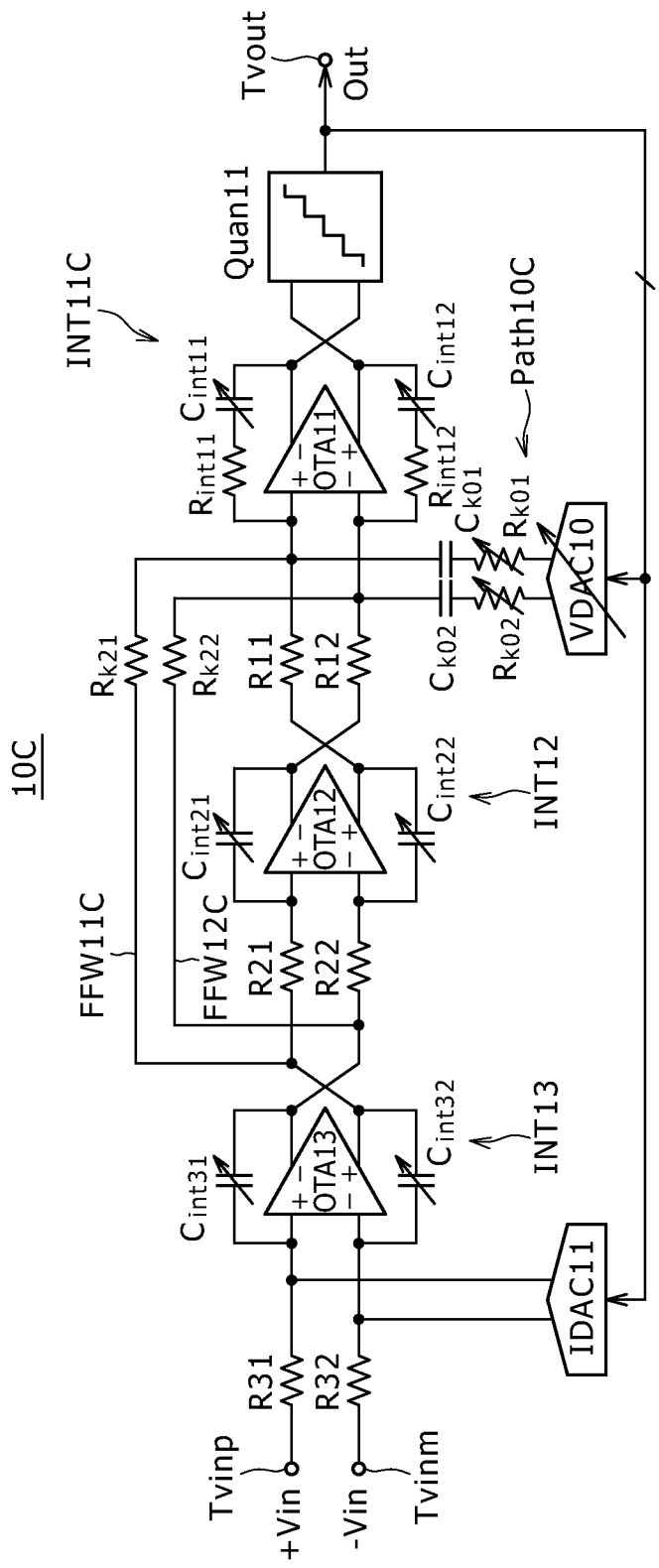
FIG. 19 is a circuit diagram showing an overall structure of a feed-forward continuous-time 3rd-order delta-sigma modulator which constitutes a fourth embodiment of the present disclosure and which has a feedback path for delay compensation.

FIG. 19 is a circuit diagram showing an overall structure of a feed-forward continuous-time 3rd-order delta-sigma modulator 10C which constitutes the fourth embodiment of the present disclosure and which has a feedback path for delay compensation.

The major differences between the delta-sigma modulator 10C as the fourth embodiment and the delta-sigma modulator 10A as the second embodiment are as follows:

In the delta-sigma modulator 10C, a capacitor $C_{k01}$ and a resistor $R_{k01}$ are serially connected to a zero-order feedback path Path10C, and a capacitor $C_{k02}$ and a resistor $R_{k02}$ are serially connected also to the zero-order feedback path Path10C.

And resistors $R_{int11}$ and $R_{int12}$ are connected serially to capacitors $C_{int11}$ and $C_{int12}$ of a first integrator INT11C, respectively.

Also, solely resistors $R_{k21}$ and $R_{k22}$ are connected to feed-forward paths FFW11C and FFW12C, respectively.

In this case, too, it would be desirable to have only the capacitors $C_{k01}$ and $C_{k02}$ arranged to be switched. However, this arrangement also entails inordinately reducing the capacity value.

Thus when the output range of the digital-analog converter VDAC10 and the resistance of the resistors $R_{k01}$ and $R_{k02}$ are both multiplied by $(1+\Delta)$ as indicated by the expression (3) shown below, it is possible to obtain substantially the same effect as when the capacitance of the capacitors $C_{int11}$ and $C_{int12}$ is multiplied by $(1+\Delta)$.

$$VDACout \Big/ \Big\{ R_{k0} + \frac{1}{sC_{k0} \cdot (1+\Delta)} \Big\} = \qquad (3)$$
$$\{VDACout \cdot (1+\Delta)\} \Big/ \Big\{ R_{k0} \cdot (1+\Delta) + \frac{1}{sC_{k0}} \Big\}$$

In this case, too, the calibration codes for capacity switching can be used for the switching of both the digital-analog converter VDAC10 and the resistance $R_{k0}$.

As explained above, the delta-sigma modulator constituting the fourth embodiment offers the following major effects:

Even if the element size is small, the strength of the zero-order feedback path can be switched appropriately. This makes it possible to bring the filter characteristic of the delta-sigma modulator close to ideal.

If the filter order is high or if the number of quantization bits is large, it is possible to reduce the number of the elements to be switched through calibration.

Where the element value is to be changed using switches, the parasitic capacity of the switches and the switch-on resistance can degrade such characteristics of the delta-sigma modulator as stability and peak gain. By contrast, the fourth embodiment has its reference values switched when changing the output range of the digital-analog converter. This significantly reduces the possibility of the delta-sigma modulator deteriorating in characteristics due to the presence of parasitic capacity.

Also, the output range of the digital-analog converter can be switched using the calibration codes for capacity switching. There is no need to devise a new arrangement for code generation.

These features combine to reduce the margins for stability, which translates into an improved SNR of the delta-sigma modulator.

5. Fifth Embodiment

FIG. 20 is a block diagram showing a typical structure of a signal processing system 100 constituting the fifth embodiment of the present disclosure.

The signal processing system 100 is formed as a system to which any of the delta-sigma modulators 10 through 10C serving as the analog-digital converters constituting the first through the fourth embodiments may be applied. For example, this signal processing system 100 may be used in conjunction with a receiving apparatus of communication equipment.

The signal processing system 100 is structured to include an analog signal processing circuit 100, an analog-digital converter 120, and a digital signal processing circuit 130.

In the signal processing system 100, the analog-digital converter 120 may be any one of the delta-sigma modulators 10 through 10C acting as the analog-digital converters constituting the first through the fourth embodiments.

The signal processing system 100 of FIG. 20 is expected to be smaller in size while operating more efficiently if signal processing is carried out as much as possible by the digital signal processing circuit 130, with the analog signal processing circuit 110 reduced in scale.

In order to implement the above-outlined system, i.e., to let the digital signal processing circuit 130 take over the signal processing from the analog signal processing circuit 110, it is generally necessary to perform analog-digital conversion without corrupting the information of the original signal as much as possible. This generally requires an analog-digital converter having a high signal-to-noise ratio.

Although the preferred embodiments of the present disclosure were described above primarily with a view to performing differential operations, this is not limitative of the present disclosure. Alternatively, the present disclosure may be applied to both single and differential operations.

The present disclosure may also be structured as follows:

(1) A delta-sigma modulator including:

a plurality of integrators configured to be connected in cascade to the input of an analog signal;

a quantifier configured to quantify an output signal from the final-stage integrator among the plurality of integrators so as to output a digital signal;

a zero-order feedback path configured to compensate for an internal loop delay in the output of the quantifier; and a voltage output type digital-analog (DA) converter configured to be located on the zero-order feedback path and to convert the output digital signal from the quantifier into an analog signal;

wherein the voltage output type digital-analog converter is connected in capacity to the final-stage integrator and switches an output amplitude in accordance with a calibration code that is supplied.

(2) The delta-sigma modulator described in (1) above, wherein the final-stage integrator includes:

an operational amplifier; and an integral capacity connected between the input and output terminals of the operational amplifier.

(3) The delta-sigma modulator described in (1) above, wherein a resistor is serially connected to a capacity coupled with the final-stage integrator; and the final-stage integrator includes an operational amplifier, and an integral capacity and a resistor connected serially between the input and output terminals of the operational amplifier.

(4) The delta-sigma modulator described in (1) or (2) above, further including:

a filter portion configured to include at least one integrator connected via a resistor to the input side of the final-stage integrator; and a feedback digital-analog converter configured to convert the digital signal from the quantifier into an analog signal that is supplied to the input side of each of the integrators in the filter portion and to the input side of the final-stage integrator.

(5) The delta-sigma modulator described in any one of (1) through (3) above, further including:

a filter portion configured to include at least two integrators connected via a resistor to the input side of the final-stage integrator;

a feedback digital-analog converter configured to convert the digital signal from the quantifier into an analog signal that is supplied to the input side of the first-stage integrator of the filter portion; and a feed-forward path configured to feed forward the output of at least the first-stage integrator to the input side of the final-stage integrator via at least either a resistance or a capacity.

(6) The delta-sigma modulator described in (4) or (5), wherein each of the integrators of the filter portion includes:

an operational amplifier; and an integral capacity connected between the input and output terminals of the operational amplifier.

(7) A signal processing system including a delta-sigma modulator having an analog-digital conversion function for converting an analog signal from an analog signal processing system into a digital signal, wherein the delta-sigma modulator includes a plurality of integrators configured to be connected in cascade to the input of the analog signal, a quantifier configured to quantify an output signal from the final-stage integrator among the plurality of integrators so as to output the digital signal, a zero-order feedback path configured to compensate for an internal loop delay in the output of the quantifier, and a voltage output type digital-analog converter configured to be located on the zero-order feedback path and to convert the output digital signal from the quantifier into the analog signal; and the voltage output type digital-analog converter is connected in capacity to the final-stage integrator and switches an output amplitude in accordance with a calibration code that is supplied.

The present disclosure contains subject matter related to that disclosed in Japanese Priority Patent Application JP 2011-022365 filed in the Japan Patent Office on Feb. 4, 2011, the entire content of which is hereby incorporated by reference.

It should be understood by those skilled in the art that various modifications, combinations, sub-combinations and alternations may occur depending on design requirements and other factors insofar as they are within the scope of the appended claims or the equivalent thereof.

What is claimed is:

1. A delta-sigma modulator comprising:
a plurality of integrators configured to be connected in cascade to the input of an analog signal;
a quantifier configured to quantify an output signal from the final-stage integrator among said plurality of integrators so as to output a digital signal;
a zero-order feedback path configured to compensate for an internal loop delay in the output of said quantifier; and
a voltage output type digital-analog converter configured to be located on said zero-order feedback path and to convert the output digital signal from said quantifier into an analog signal,
wherein said voltage output type digital-analog converter is connected to said final-stage integrator via a first capacitor, and said voltage output type digital-analog converter switches an output amplitude in accordance with a calibration code that is supplied.

2. The delta-sigma modulator according to claim 1, wherein said final-stage integrator includes:
an operational amplifier; and
an integral capacitor connected between the input and output terminals of said operational amplifier.

3. The delta-sigma modulator according to claim 2, further comprising:
a filter portion configured to include at least one integrator connected via a resistor to the input side of said final-stage integrator; and
a feedback digital-analog converter configured to convert said digital signal from said quantifier into an analog signal that is supplied to the input side of each of the integrators in said filter portion and to the input side of said final-stage integrator.

4. The delta-sigma modulator according to claim 1, wherein
a resistor is serially connected to a second capacitor coupled with said final-stage integrator; and
said final-stage integrator includes
an operational amplifier, and
an integral capacitor and a resistor connected serially between the input and output terminals of said operational amplifier.

5. The delta-sigma modulator according to claim 4, further comprising:
a filter portion configured to include at least two integrators connected via a resistor to the input side of said final-stage integrator;
a feedback digital-analog converter configured to convert said digital signal from said quantifier into an analog signal that is supplied to the input side of the first-stage integrator of said filter portion; and
a feed-forward path configured to feed forward the output of at least said first-stage integrator to the input side of said final-stage integrator via at least either a first resistor or a third capacitor.

6. The delta-sigma modulator according to claim 5, wherein each of the integrators of said filter portion includes:
an operational amplifier; and
an integral capacitor connected between the input and output terminals of said operational amplifier.

7. A signal processing system comprising:
a delta-sigma modulator having an analog-digital conversion function for converting an analog signal from an analog signal processing system into a digital signal, wherein
said delta-sigma modulator includes
a plurality of integrators configured to be connected in cascade to the input of said analog signal,
a quantifier configured to quantify an output signal from the final-stage integrator among said plurality of integrators so as to output the digital signal,
a zero-order feedback path configured to compensate for an internal loop delay in the output of said quantifier, and
a voltage output type digital-analog converter configured to be located on said zero-order feedback path and to convert the output digital signal from said quantifier into said analog signal; and
said voltage output type digital-analog converter is connected in capacitor to said final-stage integrator via a first capacitor, and said voltage output type digital-analog converter switches an output amplitude in accordance with a calibration code that is supplied.

8. The delta-sigma modulator according to claim 2, wherein the first capacitor includes a fourth capacitor connected between a first output terminal of the voltage output type digital-analog converter and a positive input terminal of the operational amplifier.

9. The delta-sigma modulator according to claim 8, wherein the first capacitor includes a fifth capacitor connected between a second output terminal of the voltage output type digital-analog converter and a negative input terminal of the operational amplifier.

10. The delta-sigma modulator according to claim 1, wherein the voltage output type digital-analog converter includes a decoder configured to decode the calibration code, the calibration code being output from a control system.

11. The delta-sigma modulator according to claim 5, wherein the feed-forward path is configured to feed forward the output of at least said first-stage integrator to the input side of said final-stage integrator via the first resistor.

12. The delta-sigma modulator according to claim 5, wherein the feed-forward path is configured to feed forward the output of at least said first-stage integrator to the input side of said final-stage integrator via the third capacitor.

13. The delta-sigma modulator according to claim 5, wherein the feed-forward path is configured to feed forward the output of at least said first-stage integrator to the input side of said final-stage integrator via the first resistor and the third capacitor.

14. The delta-sigma modulator according to claim 13, wherein the first resistor includes a second resistor and a third resistor, and the third capacitor includes a sixth capacitor and a seventh capacitor, and wherein
the second resistor and the sixth capacitor are connected in parallel to first section of the feed-forward path, and the third resistor and the seventh capacitor are connected in parallel to a second section of the feed forward path.

* * * * *